(12) United States Patent
Yamamoto

(10) Patent No.: US 10,763,073 B2
(45) Date of Patent: Sep. 1, 2020

(54) ION SOURCE, ION BEAM IRRADIATION APPARATUS, AND OPERATING METHOD FOR ION SOURCE

(71) Applicant: NISSIN ION EQUIPMENT CO., LTD., Koka, Shiga (JP)

(72) Inventor: Tetsuro Yamamoto, Koka (JP)

(73) Assignee: NISSIN ION EQUIPMENT CO., LTD., Koka, Shiga (JP)

( * ) Notice: Subject to any disclaimer, the term of this patent is extended or adjusted under 35 U.S.C. 154(b) by 0 days.

(21) Appl. No.: 16/256,124

(22) Filed: Jan. 24, 2019

(65) Prior Publication Data

US 2019/0318904 A1 Oct. 17, 2019

(30) Foreign Application Priority Data

Apr. 12, 2018 (JP) ................. 2018-077176

(51) Int. Cl.
 *H01J 37/08* (2006.01)
 *H01J 37/05* (2006.01)

(52) U.S. Cl.
 CPC .............. *H01J 37/08* (2013.01); *H01J 37/05* (2013.01)

(58) Field of Classification Search
 CPC .................. H01J 37/08; H01J 37/05
 USPC ........... 250/492.1, 492.2, 492.3, 423 R, 424
 See application file for complete search history.

(56) References Cited

U.S. PATENT DOCUMENTS

| | | | | |
|---|---|---|---|---|
| 2008/0067412 | A1* | 3/2008 | Vanderberg | H01J 27/08 250/427 |
| 2009/0212232 | A1* | 8/2009 | Yamashita | H01J 27/022 250/423 R |
| 2010/0264328 | A1* | 10/2010 | Biloiu | H01J 37/08 250/424 |
| 2018/0138008 | A1* | 5/2018 | Hahto | H01J 37/3171 |

FOREIGN PATENT DOCUMENTS

JP 2016-164894 A 9/2016

* cited by examiner

*Primary Examiner* — Nicole M Ippolito
(74) *Attorney, Agent, or Firm* — Sughrue Mion, PLLC

(57) ABSTRACT

An ion source is provided. The ion source includes a plasma generation container, an electron supply, an electromagnet and a shift means. The plasma generation container generates an ion beam to be extracted therefrom in an ion beam extraction direction. The electron supply supplies electrons into the plasma generation container. The electromagnet generates a magnetic field for capturing the electrons from the electron supply. The shift means shifts a center of the magnetic field in the ion beam extraction direction to change a rate of a desired type of ion to be contained in the ion beam.

15 Claims, 8 Drawing Sheets

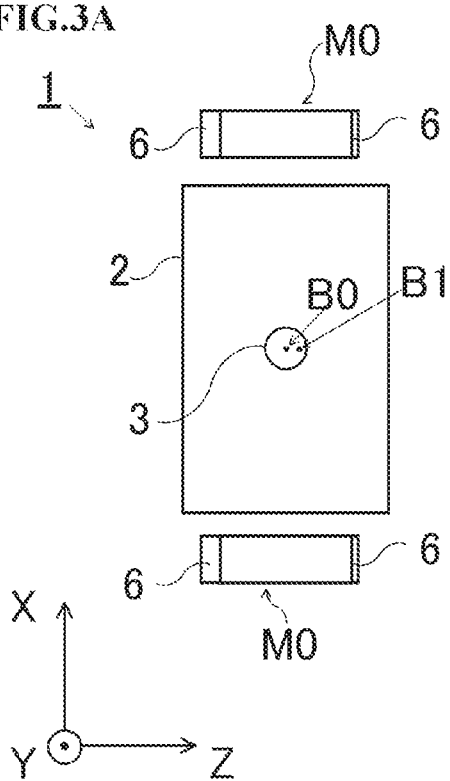
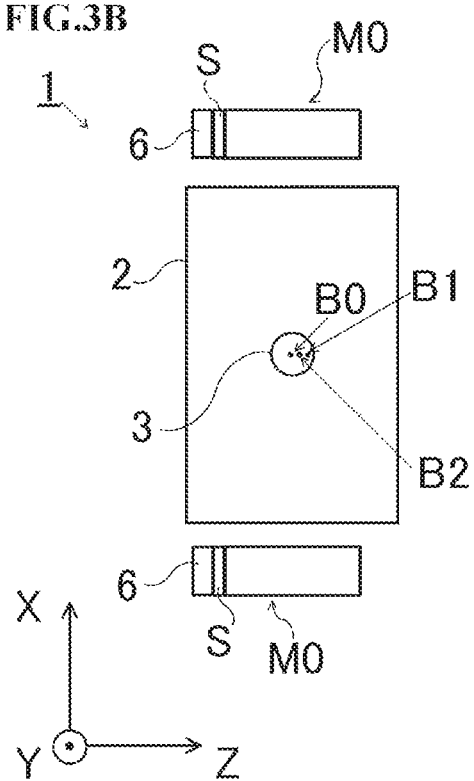
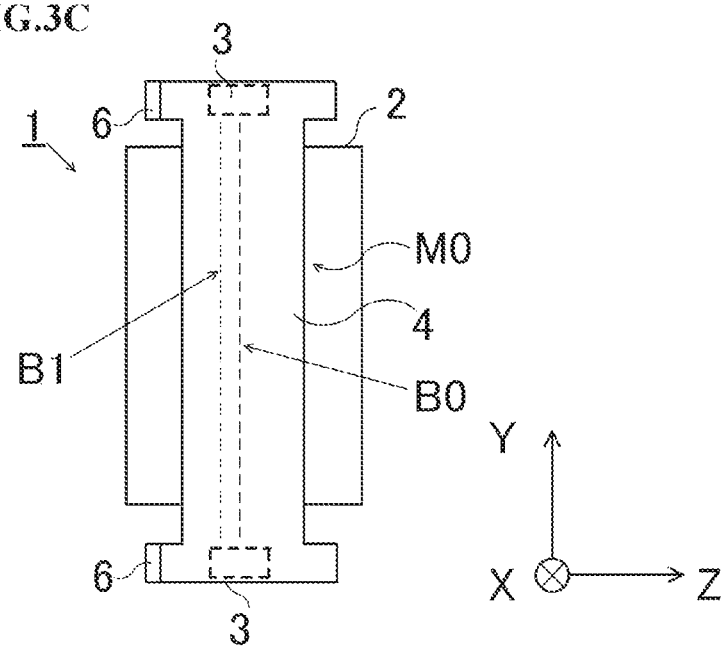

ION SOURCE, ION BEAM IRRADIATION APPARATUS, AND OPERATING METHOD FOR ION SOURCE

CROSS-REFERENCE TO RELATED APPLICATION

This application claims priority from Japanese Patent Application No. JP2018-7716, filed in the Japanese Patent Office on Apr. 12, 2018, the disclosure of which is incorporated by reference herein in its entirety.

BACKGROUND

1. Field

Exemplary embodiments relate to an ion source capable of changing the rate of a desired type of ion to be contained in an ion beam.

2. Description of Related Art

As an ion source capable of changing the rate of a desired type of ion to be contained in an ion beam, there has been known an ion source described in JP 2016-164894A.

The ion source described in JP 2016-164894A includes a mechanism for changing the position of a cathode depending on the type of ionizable gas for use in producing a P-type or N-type semiconductor device. By use of this mechanism, a distance between the cathode and an ion ejection surface of a plasma generation container can be changed to change the rate of a desired type of ion to be contained in an ion beam.

Specifically, in a case where the ionizable gas is PH3, the cathode is moved to come close to the ion ejection surface so as to increase the rate of PHx+(x is an integer of 1 to 3) having a relatively large mass, in a generated plasma. On the other hand, in a case where the ionizable gas is BF3, the cathode is moved to come away from the ion ejection surface, as compared to the case of PH3, so as to increase the rate of B+ having a relatively small mass.

However, in the related art ion source, the cathode will deteriorate with age and become brittle. Thus, there is concern that, if such a brittle cathode is moved, the brittle cathode may undesirably break during the movement. In the event the cathode breaks, the cathode must be replaced, the inside of the plasma generation container must be cleaned, etc., which causes deterioration in operation rate of the ion source.

SUMMARY

It is an aspect to provide an ion source capable of changing the rate of a desired type of ion to be contained in an ion beam, while preventing deterioration in operation rate of the ion source due to breakage of a cathode, and further provide an operating method for the ion source.

According to an aspect of one or more embodiments, there is provided an ion source which comprises a plasma generation container that generates an ion beam to be extracted therefrom in an ion beam extraction direction; an electron supply that supplies electrons into the plasma generation container; an electromagnet that generates a magnetic field for capturing the electrons from the electron supply; and shift means for shifting a center of the magnetic field in the ion beam extraction direction to change a rate of a desired type of ion to be contained in the ion beam.

According to another aspect of one or more embodiments, there is provided a method of operating an ion source that includes a plasma generation container that generates an ion beam to be extracted therefrom in an ion beam extraction direction; an electron supply that supplies electrons into the plasma generation container; and an electromagnet that generates a magnetic field for capturing the electrons from the electron supply, the method comprising shifting a center of the magnetic field in the ion beam extraction direction to change a rate of a desired type of ion to be contained in the ion beam.

According to another aspect of one or more embodiments, there is provided an ion source comprising a plasma generation container; an electron supply that supplies electrons into the plasma generation container; two electromagnets, disposed at opposite sides of the plasma generation container in a first direction that is orthogonal to an ion beam extraction direction, that generate a magnetic field for capturing the electrons from the electron supply; and a detachable magnetic shield attached to at least one of the two electromagnets.

BRIEF DESCRIPTION OF THE DRAWINGS

The above and/or other aspects will become apparent and more readily appreciated from the following description of example embodiments, taken in conjunction with the accompanying drawings of which:

FIGS. 3A-3C are plan views of some examples of an ion source according to another embodiment, where FIG. 3A depicts an example in which a pair of magnetic shields having different thicknesses are provided, respectively, at opposite lateral ends of an electromagnet; FIG. 3B depicts another example in which a spacer is provided between an electromagnet and a magnetic shield; and FIG. 3C depicts yet another example in which a magnetic shield is provided only on each end portion of an electromagnet;

FIG. 4A depicts an example in which the ion source comprises an electromagnet configured to be rotatable, and FIG. 4B depicts another example in which the ion source comprises an electromagnet configured to be linearly displaceable;

DETAILED DESCRIPTION

Figure 1:
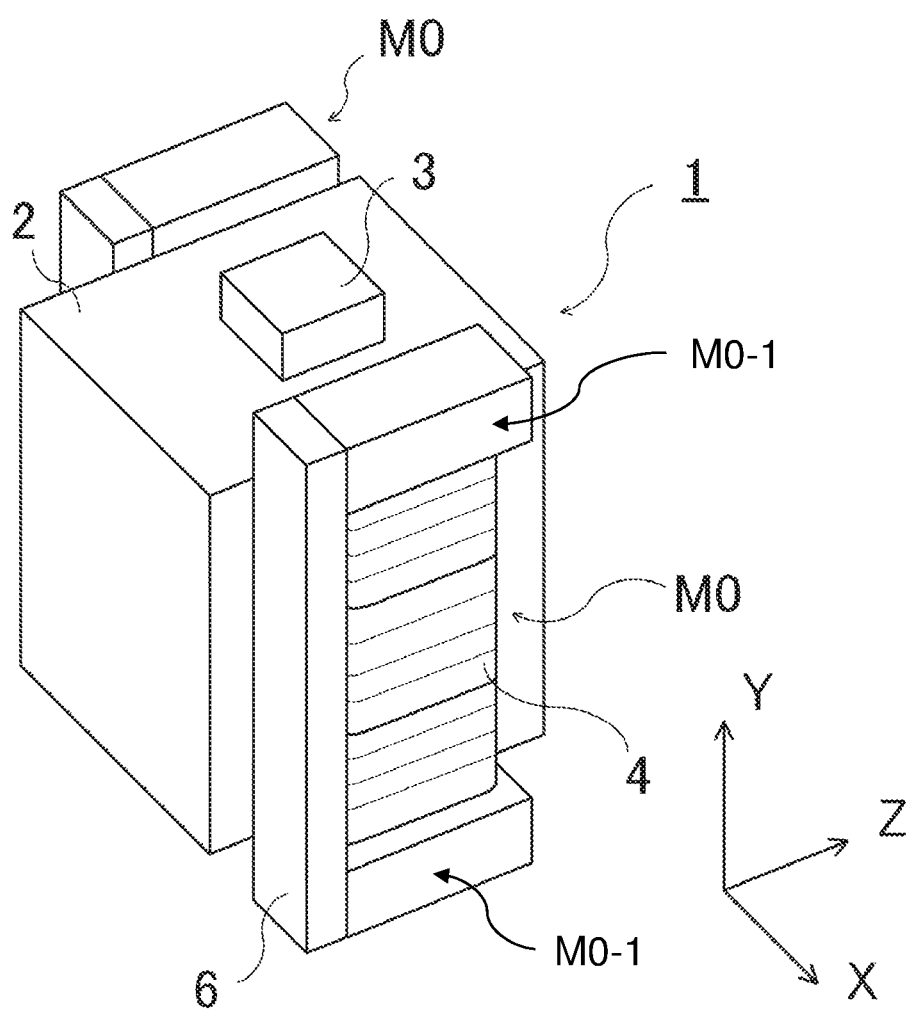
FIG. 1 is a perspective view depicting an ion source according to an embodiment.

The embodiments of the present disclosure may be diversely modified. However, it is to be understood that the present disclosure is not limited to a specific embodiment, but includes all modifications, equivalents, and substitutions of embodiments disclosed herein without departing from the scope and spirit of the present disclosure and claims.

In the ion source according to various embodiments disclosed herein, instead of changing the position of a cathode, a center of a magnetic field to be generated by an electromagnet is positionally shifted using a shift means to change a rate of a desired type of ion to be contained in an ion beam, so that it is possible to avoid the occurrence of breakage of the cathode during the change of the cathode position. This makes it possible to prevent deterioration in operation rate of the ion source due to breakage of the cathode.

In the operating method according to various embodiments disclosed herein, instead of moving a cathode, a technique of shifting a center of a magnetic field is employed, so that it is possible to avoid the occurrence of breakage of a cathode during a change of a cathode position, even if a rate of a desired type in the ion beam is changed. This makes it possible to prevent deterioration in operation rate of the ion source due to breakage of the cathode.

Various embodiments will now be described with respect to the drawing figures.

FIG. 1 is a perspective view depicting an ion source according to an embodiment. In FIG. 1, a Z direction is an ion beam extraction direction along which an ion beam is extracted from the ion source 1, and a Y direction is a longitudinal direction of a plasma generation container 2 which may be approximately rectangular parallelepiped-shaped. Further, an X direction is a direction orthogonal to the Z direction and the Y direction. This definition of the X, Y and Z directions is also applied to the after-mentioned figures.

As shown in FIG. 1, an ion source 1 has an approximately rectangular parallelepiped shape which is long in the Y direction. The ion source 1 comprises the plasma generation container 2, and an electron supply 3 for supplying electrons into the plasma generation container 2. The electron supply 3 includes, e.g., a filament, a combinational structure of a plate-shaped cathode and a filament, or an electron gun for supplying electrons accelerated by given energy. The electron supply 3 may be disposed inside or outside the plasma generation container 2, depending on the configuration of the ion source 1.

The ion source 1 also comprises a pair of electromagnets M0 arranged, respectively, on opposite sides of the plasma generation container 2 in the X direction to generate a magnetic field with respect to the plasma generation container 2. Each of the electromagnets M0 has a magnet body which is long in the Y direction, and opposite end portions M0-1 each protruding from the magnet body in the Z direction. The magnet body is wound by a coil 4. In some embodiments, the electromagnets M0 may be formed of a single magnetic body with the opposite end portions M0-1 provided integrally with the magnetic body and thus formed as one piece of yoke. Alternatively, the magnetic body may be provided separately from the opposite end portions M0-1, and the opposite end portions M0-1 may be attached to the magnetic body to form the electromagnets M0.

Further, a magnetic shield 6 is attached to each of the electromagnets M0. An ion beam is extracted in an ion beam extraction direction, i.e., the Z direction. The magnetic shield 6 is attached to each of the electromagnets M0 to shield an edge of the electromagnet M0 that faces a direction opposite to the ion beam extraction direction. It should be noted that the opposite end portions M0-1 protrude from the magnetic body in the Z direction. These protruding end portions generate a broader magnetic field region, which covers almost the whole plasma generation container 2 in the Z direction, compared to a magnetic body without end portions (i.e., a pole yoke). Additionally, these protrusions are advantageous to easily attach the magnetic shield 6 to the electromagnets M0. However, in some embodiments, the magnetic body (i.e., yoke) may be provided without the opposite end portions M0-1 protruding in the Z-direction.

An ionizable gas such as BF3 or PH3 is introduced into the ion source 1 through a non-depicted gas port. The introduced ionizable gas is ionized by electrons (thermions) supplied from the electron supply 3, so that plasma is generated in the plasma generation container 2. Subsequently, the generated plasma is ejected outside the plasma generation container 2 in the form of an ion beam, by a non-depicted extraction electrode disposed downstream of the container 2 in the Z direction.

Figure 2A:
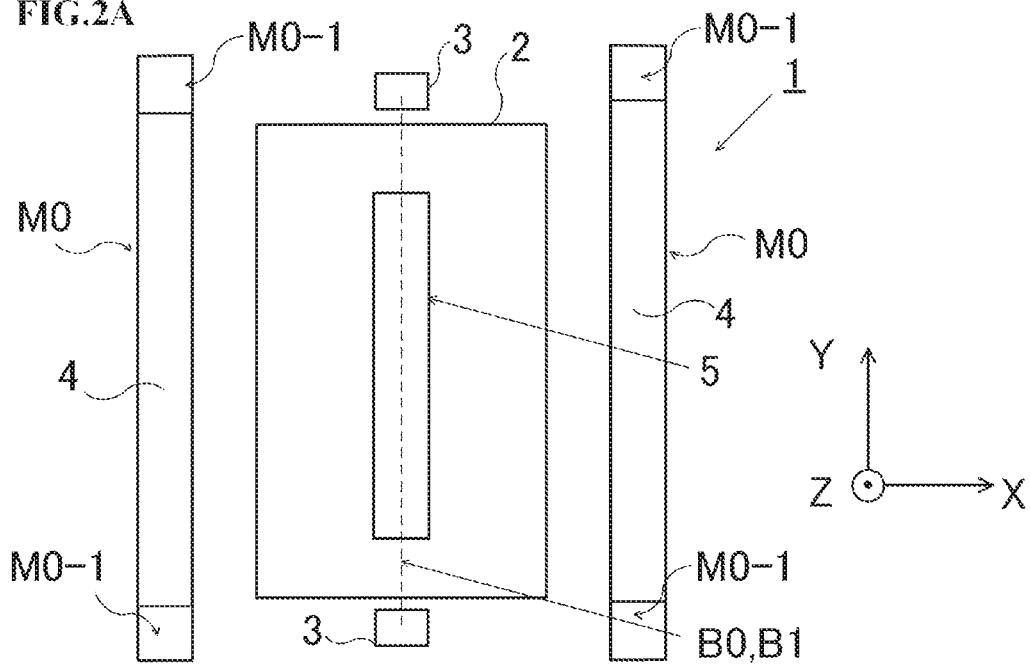
FIGS. 2A-2C are, respectively, an X-Y plan view, a Y-Z plan view and a Z-X plan view of the ion source depicted in FIG. 1.
Figure 2B:
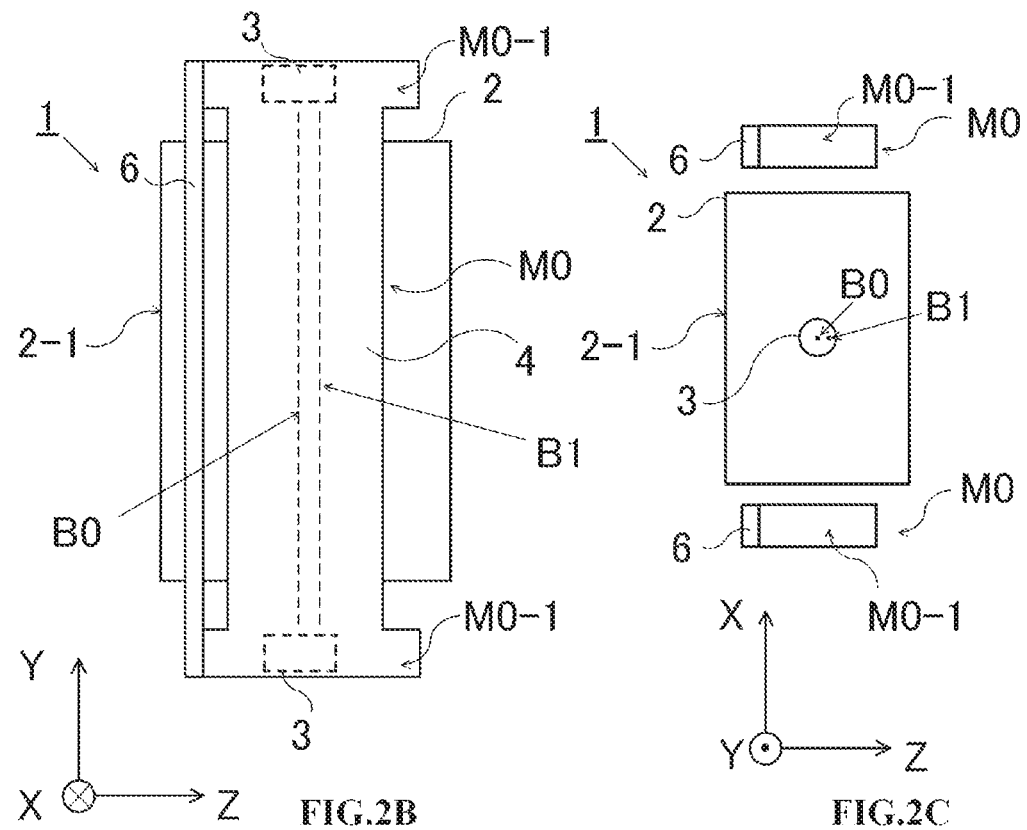
Figure 2C:
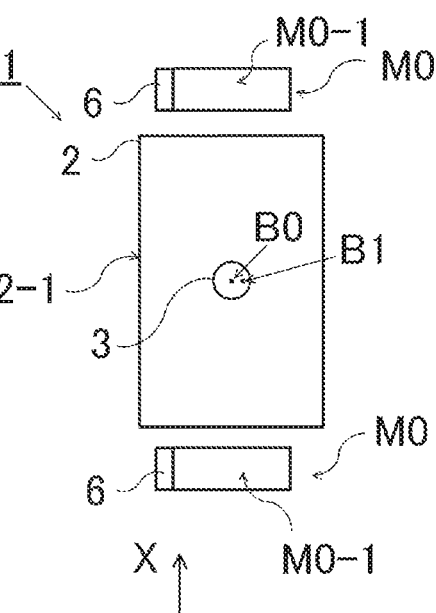

FIGS. 2A-2C are, respectively, X-Y, Y-Z and Z-X plan views of the ion source 1 depicted in FIG. 1. The following description will be made on the assumption that magnetic fields generated by the pair of electromagnets M0 arranged along the X direction are the same in terms of magnitude and direction, and the center of a magnetic field in the X-Y plane (hereinafter referred to as "magnetic field center") is positionally coincident with the center of the plasma generation container 2. It should be noted that a magnetic field distribution to be generated in the plasma generation container 2 may be modified in various patterns, and the position of the magnetic field center described here is only an example. Other magnetic field distributions are contemplated.

The position of the magnetic field center denotes a position where magnetic density becomes strongest. In the case where the pair of electromagnets M0 having the same configuration are arranged, respectively, at opposite sides of the plasma generation container 2 in the X direction as shown in FIG. 1, and magnetic fields of the pair of electromagnets M0 are set to be the same in terms of magnitude and direction, as in the ion source depicted in FIG. 1 and FIGS. 2A-2C, an intermediate position between the pair of electromagnets corresponds to the magnetic field center.

In FIGS. 2A-2C, a first position of the magnetic field center when the magnetic shield 6 is detached is indicated as a magnetic field center position B0, and a second position of the magnetic field center when the magnetic shield 6 is attached is indicated as a magnetic field center position B1.

In the case of providing the magnetic shield 6, the magnetic field passes through the magnetic shield extending in the Y direction on the side of one end of each of the electromagnets facing the direction opposite to the Z direction (i.e., the direction opposite to the ion beam extraction direction), so that the magnetic field corresponding to the one end is weakened as compared to the case in which the magnetic shield 6 is not used. On the other hand, no magnetic shield is provided on the side of the other end of each of the electromagnets (i.e., an end facing the Z direction (the ion beam extraction direction)), so that there is no change in magnetic field intensity within plasma generation container 2. Thus, as seen in FIGS. 2B-2C, the magnetic field center in the plasma generation container 2 will be shifted toward the ion beam extraction direction which is the Z direction, specifically, from the magnetic field center position B0 to the magnetic field center position B1 when the magnetic shield 6 is attached.

It should be noted that, in an actual implementation, the magnetic field center after the shifting has a curved shape convexed in the Z direction, instead of a linear shape along the Y direction as depicted in FIGS. 2A-2C. However, in this specification, for the sake of simplifying the description, the shape of the magnetic field center after the shifting is depicted as an approximate linear line. This handling of using an approximate linear line is also applied to the after-mentioned other embodiments.

When the position of the magnetic field center is shifted, a position where electrons are captured in the magnetic field is changed accordingly. The density of a plasma to be generated tends to become higher as the amount of electrons to be captured becomes larger. Thus, when the position where electrons are captured in the magnetic field is changed, a position where a high-density plasma is generated in the magnetic field is changed accordingly.

Ions in a plasma move and revolve along the magnetic field as with electrons. In this situation, a revolving radius of an ion becomes larger as the ion has a larger mass.

Thus, as the magnetic field center lies at a position closer to an inner wall surface 2-1 on the side opposite of the plasma generation chamber 2 from an ion ejection opening 5 of the plasma generation container 2, in the ion beam extraction direction, the probability that ions having a relatively large mass and thus being revolving with a relatively large revolving radius disappear due to collision with the inner wall surface 2-1 becomes higher.

As a result, among entire ions to be contained in an ion beam to be extracted, the rate of ions having a relatively small mass is increased. In other words, when the magnetic field center lies at a position closer to the inner wall surface 2-1, ions having a relatively large mass disappear due to collision with the inner wall surface 2-1, thus increasing a rate of ions having a relatively small mass in plasma.

On the other hand, as the magnetic field center lies at a position closer to the ion ejection opening 5 of the plasma generation container 2, in the ion beam extraction direction, the rate of ions having a relatively large mass among entire ions to be contained in an ion beam to be extracted is increased. This is because the probability that ions having a relatively large mass disappear due to collision with the inner surface of the plasma generation container becomes lower. In other words, when the magnetic field center lies at a position farther from the inner wall surface 2-1 (and closer to the ion ejection opening 5), ions having a relatively large mass do not collide with the inner wall surface 2-1 as much, and thus the ions having a relatively larger mass are increased.

In the ion source depicted in FIGS. 2A-2C since the magnetic shield 6 is attached, the magnetic field center comes close to the ion ejection opening 5, and therefore the rate of ions having a relatively large mass among entire ions to be contained in an ion beam to be extracted is increased.

In the embodiment shown in FIGS. 1-2C, the magnetic shield 6 used for shifting the magnetic field center is detachably attached to one end of the electromagnet M0, for example, by a fastener such as a bolt or by means of fitting engagement. The number of the magnetic shields 6 may be one per electromagnet as shown in FIGS. 1-2C However, in some embodiments, the number of magnetic shields 6 may be two or more per electromagnet.

For example, in a case where a plurality of types of ionizable gases are selectively used in a single ion source, the magnetic shield 6 may be attached when a certain type of ionizable gas is used, and detached when another type of ionizable gas is used.

Further, when it is advantageous to reduce the rate of ions having a relatively large mass, the magnetic shield 6 may be attached to the end of each of the electromagnets M0 in the Z direction (i.e., the end of the electromagnet facing the ion beam extraction direction), to enable the magnetic field center to be displaced away from the ion ejection opening 5, in the opposite manner to that in the embodiment shown in FIGS. 1-2C. In other words, the magnetic shield 6 would be moved to the opposite side from that shown in FIG. 2B, such that the position of the magnetic field center would be shifted towards the inner wall surface 2-1 (i.e., to the left of B0 in FIG. 2B).

FIG. 3A depicts an example of an ion source according to another embodiment, wherein a pair of magnetic shields 6 are provided, respectively, on opposite lateral ends of each of a pair of electromagnets, in the ion beam extraction direction (Z direction). Further, the magnetic shields 6 are formed to have different thicknesses in the ion beam extraction direction, as depicted in FIG. 3A, so that it is also possible to shift the magnetic field center position B0 to the magnetic field center position B1.

As a modification of the ion source 1 according to the embodiment shown in FIGS. 1-2C in which the magnetic shield 6 is disposed on only one of the opposite sides of each of the electromagnets M0, the magnetic shield 6 may include a plurality of magnetic shields having different thicknesses, wherein these magnetic shields may be selectively used to shift the magnetic field center. The magnetic shields having different thicknesses may be preliminarily prepared in advance. Alternatively, the magnetic shield 6 may include a plurality of magnetic shields having different magnetic permeabilities, wherein these magnetic shields may be selectively used to shift the magnetic field center.

Differently from the example shown in FIG. 3A, in another example depicted in FIG. 3B, the magnetic field center may be shifted by changing an attaching position of the magnetic shield 6.

Specifically, the magnetic shield 6 may be attached to one of opposite ends of each of a pair of electromagnets M0 while a spacer S is interposed therebetween, as depicted in FIG. 3B. In other words, a spacer S may be provided between the electromagnet M0 and the magnetic shield. In FIG. 3B, for convenience of understanding, the position of the magnetic field center when the magnetic shield 6 is detached is indicated as a magnetic field center position B0, and the position of the magnetic field center set when the magnetic shield 6 is attached directly to the electromagnet M0 is indicated as a magnetic field center position B1, as with the ion source depicted in FIGS. 2A-2C. Further, the position of the magnetic field center when the spacer S is interposed between the magnetic shield 6 and the electromagnets M0 is indicated as a magnetic field center position B2.

In this way, the magnetic field center may be shifted by selecting between the presence and absence of the magnetic shield, or by changing the attaching position of the magnetic shield.

As a modification of the example depicted in FIG. 3B, the spacer S may include a plurality of spacers having different thicknesses, and the spacers may be selectively used to change the position of the magnetic shield 6 to shift the magnetic field center. The spacers having different thicknesses may be preliminarily prepared in advance.

Figure 4A:
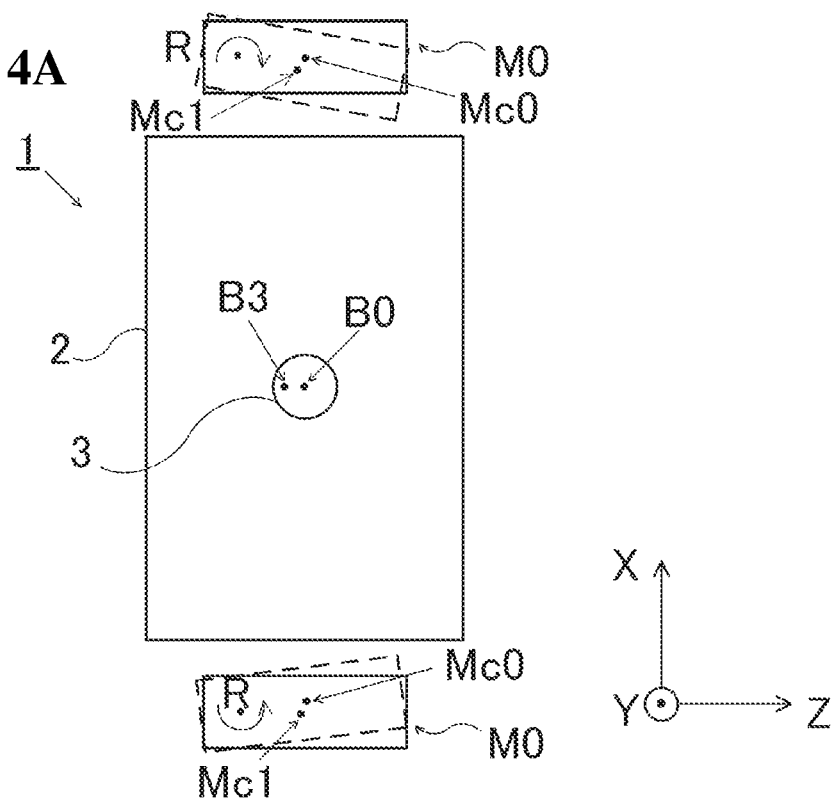
FIGS. 4A-4B are plan views of some examples of an ion source according to yet another embodiment, where
Figure 4B:
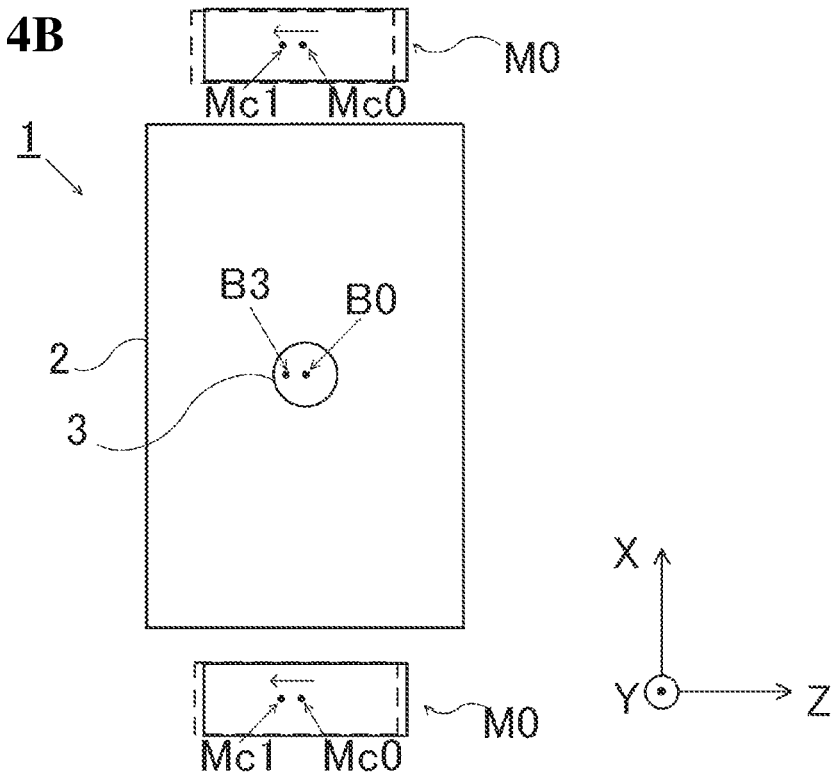

In the embodiment of FIGS. 1-2C, the magnetic shield 6 is provided to extend between the edge faces of the opposite end portions M0-1 of the electromagnet M0 each protruding in the Z direction without being wound by the coil 4. Alternatively, the magnetic shield 6 may be provided only on each of the edge faces of the end portions, as depicted in FIG. 3C. In this case, the direction of shifting of the magnetic field center is reversed as compared to the embodiment depicted in FIGS. 1-2C in which the magnetic shield 6 is provided to extend between the edge faces of the opposite end portions FIGS. 4A-4B depict examples of an ion source according to another embodiment, in which the ion source is configured to move a pair of electromagnets M0. In the embodiment shown in FIGS. 4A-4B, the magnetic field center may be shifted by moving the electromagnet M0, instead of providing the magnetic shield 6.

In the example depicted in FIG. 4A, the magnetic field center is shifted from a magnetic field center position B0 to a magnetic field center position B3, by rotating each of the electromagnets M0 about a rotation axis R extending along the Y direction, from a posture indicated by the solid line to a posture indicated by the broken line in FIG. 4A.

Further, in another example depicted in FIG. 4B, instead of rotating the electromagnet M0, the magnetic field center may be shifted from a magnetic field center position B0 to a magnetic field center position B3, by moving each of a pair of electromagnets M0 in the Z direction which is the ion beam extraction direction. For example, a linear movement mechanism may be preliminarily prepared in advance, and each of the electromagnets M0 may be moved using the linear movement mechanism. It is noted here that the term "center of the electromagnet M0" denotes the center of the magnetic poles thereof when viewed from the Y direction.

In FIGS. 4A and 4B, an embodiment has been described in which the magnetic field center position B0 is shifted to the magnetic field center position B3 by displacing the center of the electromagnet M0 from a center position Mc0 to a center position Mc1 by means of rotation or linear movement of the electromagnet M0. Alternatively, in other embodiments, the electromagnet M0 may be moved by using another mechanism such as a combination of rotation or linear movement of the electromagnet M0. That is, any other mechanism for moving the electromagnet M0 may be employed as long as it is capable of displacing the center of the electromagnet M0 in the Z direction.

The embodiment depicted in FIGS. 4A and 4B, may exhibit the same advantageous effects of the embodiments depicted in FIGS. 2A-2C and FIGS. 3A-3C. However, the embodiment depicted in FIGS. 4A-4B uses the rotation or linear movement mechanism for moving the electromagnet, and thus increases the complexity of the device configuration, and increases the cost, as compared to the embodiments using the magnetic shield.

Further, in the embodiment depicted in FIGS. 4A-4B, each of the pair of electromagnets M0 is configured to be rotationally movable and/or linearly movable. Alternatively, the pair of electromagnets M0 may be configured such that one of them is fixed, and the other is configured to be movable. In this case, the amount of displacement of the magnetic field center becomes smaller as compared to the case in which both electromagnets M0 are moved. However, even such a small displacement can cause a change in the ratio of a desired type of ion to be contained in an ion beam, as compared to a case where the electromagnets M0 are not moved at all.

Further, the electromagnets need not be set to become coincident with each other in terms of rotation direction and/or movement direction. For example, as long as magnetic fields generated by the electromagnets are the same in terms of direction and magnitude, a magnetic field center determined when they are balanced can be shifted in the ion beam extraction direction by setting the amount of movement of one of the electromagnets to a larger value than that of the other electromagnet.

Figure 5:
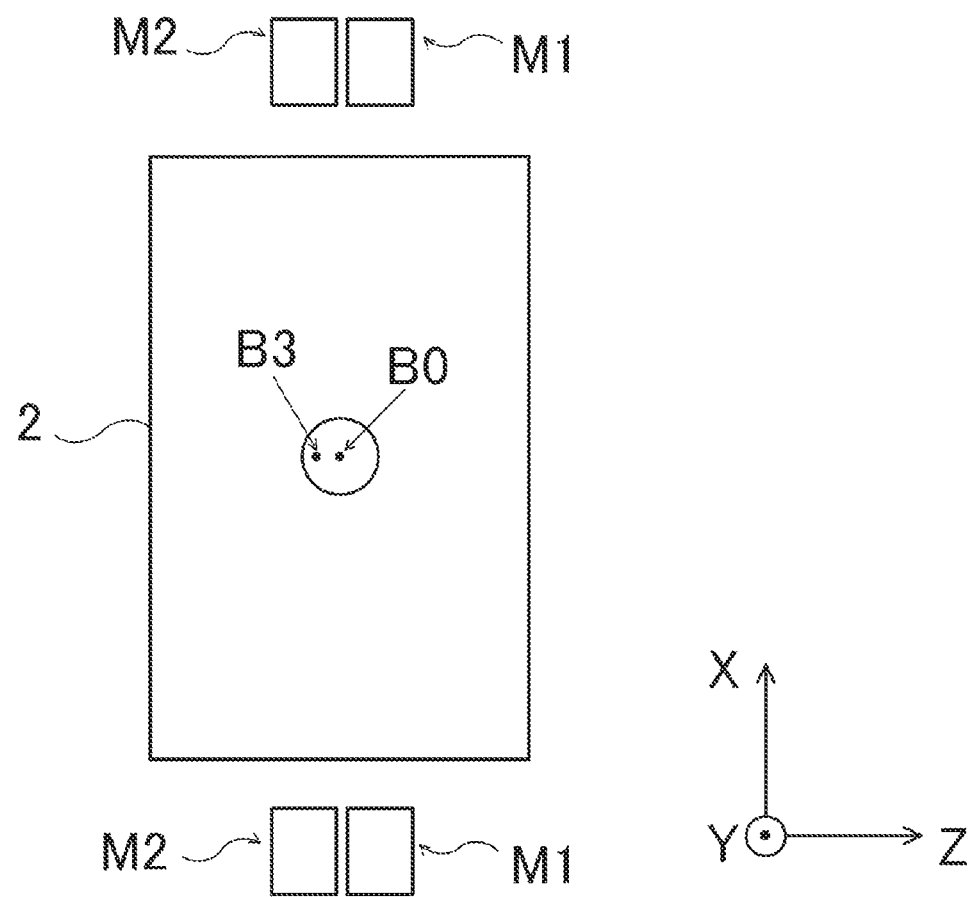
FIG. 5 is a plan view depicting an example of an ion source according to yet another embodiment, in which an ion source comprises a plurality of electromagnets arranged at different positions in an ion beam extraction direction.

Further, as depicted in FIG. 5, an ion source according to yet another embodiment may be configured to shift the magnetic field center using a plurality of electromagnets M1, M2. In the embodiment shown in FIG. 5, the term "plurality of electromagnets" denotes a plurality of electromagnets which are arranged at different positions in the ion beam extraction direction (i.e., in the Z direction). In FIG. 5, even if a plurality of electromagnets are arranged at different positions in the ion beam extraction direction, these electromagnets may be considered to be equivalent to a single electromagnet.

Each of the electromagnets M1, M2 has the same configuration as that of the electromagnet M0 depicted in FIG. 1 and FIGS. 2A-2C. In a case where each of the electromagnets M1, M2 generates a magnetic field of the same magnitude and in the same direction, the magnetic field center is set at a magnetic field center position B0. Then, the magnetic field center may be shifted to a magnetic field center position B3 by weakening the magnetic field of the electromagnets M1.

Figure 6A:
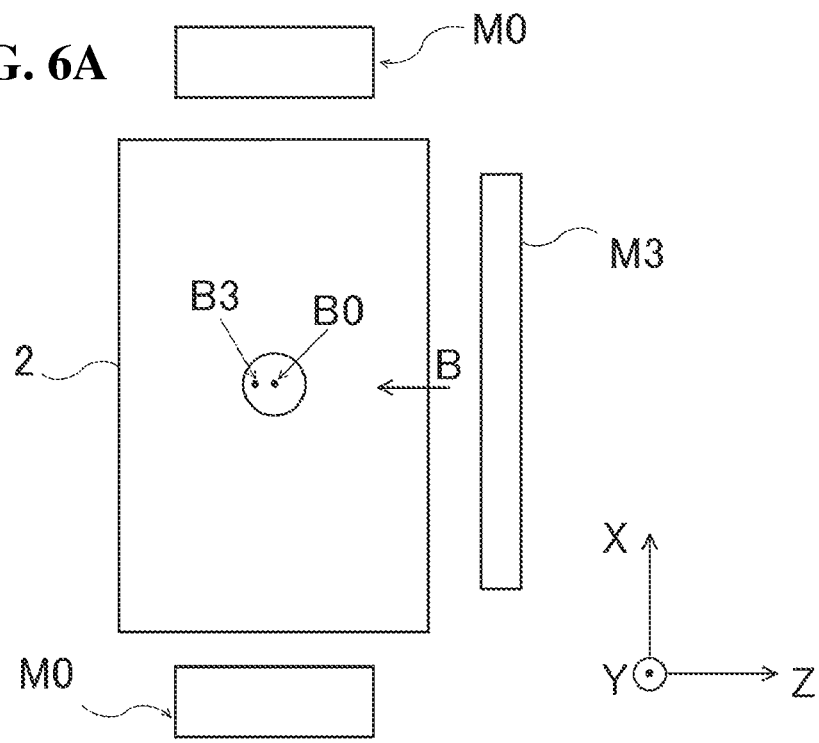
FIGS. 6A-6B are, respectively, a Z-X plan view and an X-Y plan view of another example of the ion source of FIG. 5, wherein the ion source comprises an additional electromagnet.
Figure 6B:
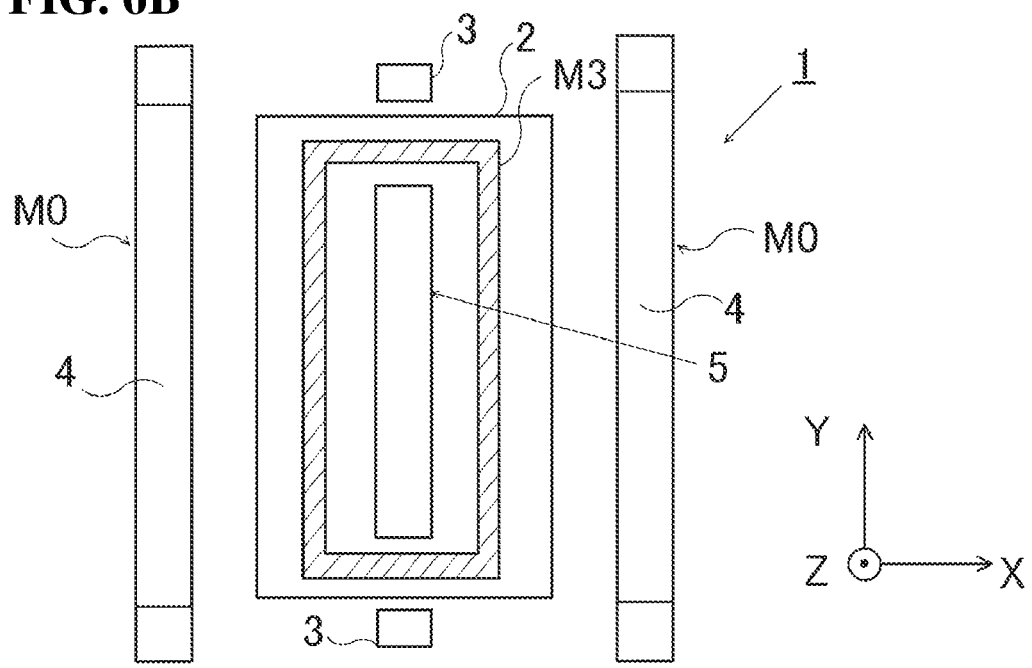

FIGS. 6A-6B are, respectively, a Z-X plan view and an X-Y plan view of another example of the ion source of FIG. 5, in which the ion source comprises an additional electromagnet. The ion source configured to shift the magnetic field center through the use of a plurality of electromagnets arranged at different positions in the ion beam extraction position may be configured such that a pair of electromagnets M0 are arranged, respectively, on opposite sides of the plasma generation container 2 in the X direction, and an additional electromagnet M3 is provided around the opening 5 of the plasma generation container 2, as depicted in FIGS. 6A-6B.

For example, the electromagnet M3 may be an air core coil. In this case, the magnetic field center can be shifted from the magnetic field center position B0 to the magnetic field center position B3 by causing the air core coil to generate a magnetic field B in a direction indicated by the arrowed line in FIG. 6A.

The mechanisms described in the above embodiments are intended to shift the magnetic field center in the Z direction. These mechanisms may also be used to correct a magnetic field distribution in the X direction, as depicted in FIG. 7.

Figure 7:
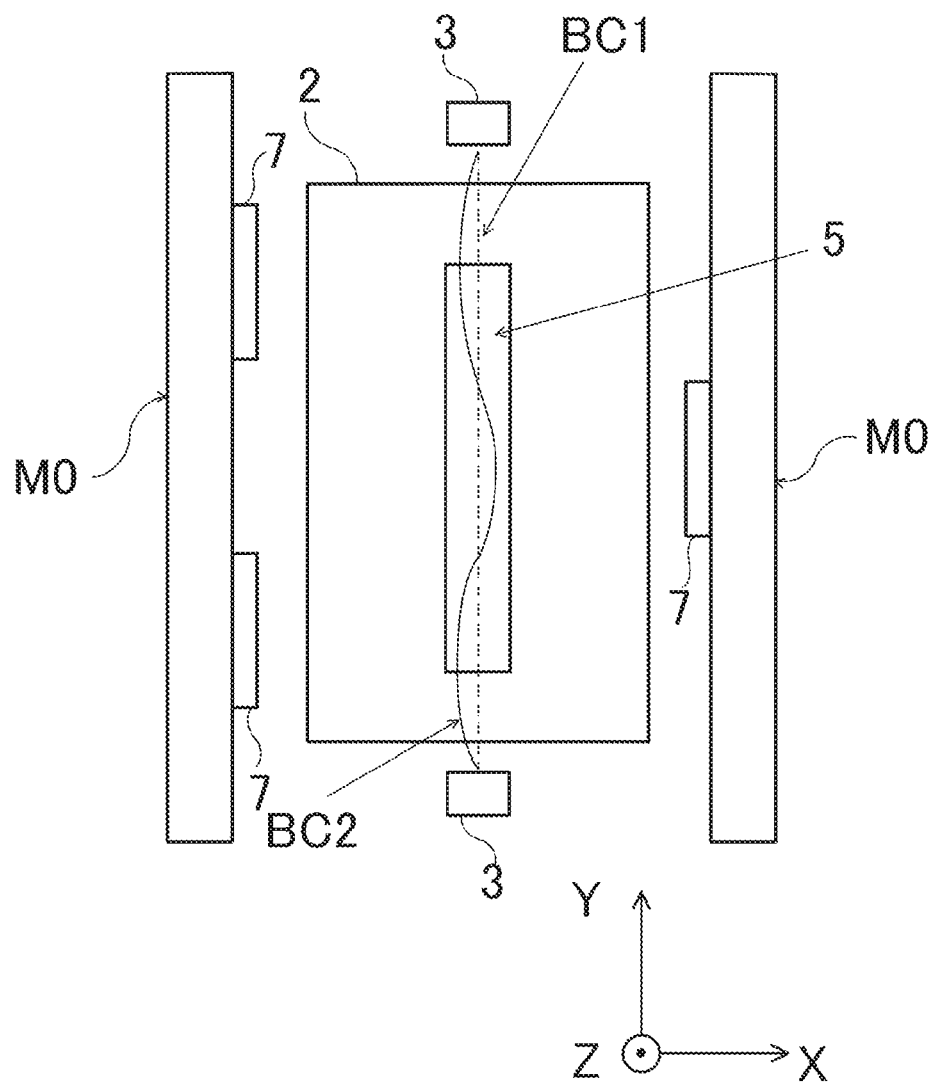
FIG. 7 is an explanatory diagram for magnetic field correction, according to an embodiment.

Normally, a typical magnetic field distribution at the magnetic field center is formed as a magnet field distribution BC1 which linearly extends in the Y direction, as indicated by the broken line in FIG. 7. However, due to an influence of magnetic field leakage from outside the ion source, a wavy distribution BC2 as indicated by the solid line may be formed.

In this situation, a plurality of magnetic pieces 7 may be attached to the electromagnets M0 at depicted positions to correct the magnetic field distribution BC2 to the magnetic field distribution BC1. By adding the magnetic pieces 7, the magnetic field distribution BC2 is changed to the magnetic field distribution BC1.

In the above embodiments, the electron supply 3 is provided on each of the opposite sides of the plasma generation container 2 in the Y direction. However, in some embodiments, the electron supply 3 may be provided on only one of the opposite sides. In the case where the electron supply 3 is provided on only one side of the plasma generation container 2, a reflective plate capable of reflecting electrons by means of electric field may be disposed at a position opposed to the electron supply 3. That is, the reflective plate may be disposed at the side in the Y direction opposite from the side in which the one electron supply 3 is disposed.

Further, in the above embodiment, the electron emission direction is in the Y direction. However, this is only an example, and in some embodiments, an electron emission direction from the electron supply 3 may be the X direction or the Z direction. Similarly, the direction of a magnetic field to be generated by the electromagnets may be set to a direction different from the Y direction.

Further, the above embodiments have been described based on an example in which the pair of electromagnets each having a magnet body which is long in the Y direction are arranged, respectively, on opposite sides of the plasma generation container 2 in the X direction. However, the configuration of the electromagnets is not limited thereto.

Figure 8A:
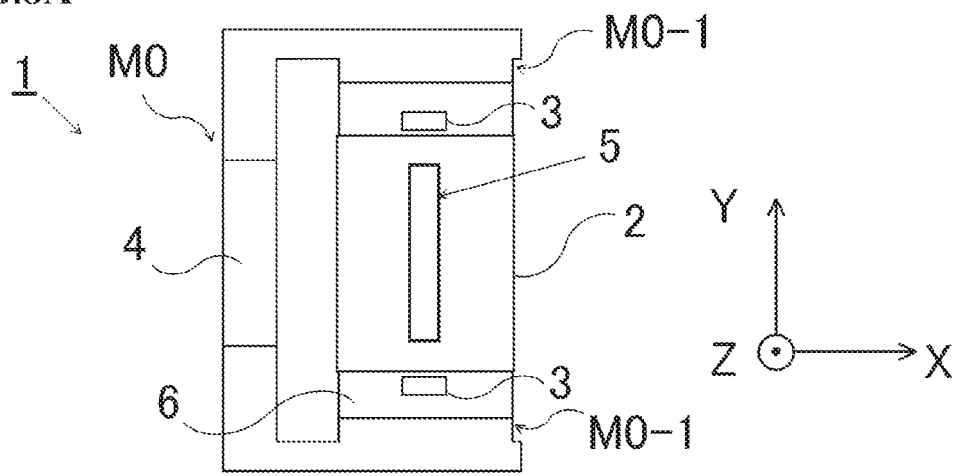
FIGS. 8A-8C are, respectively, an X-Y plan view, a Y-Z plan view and a Z-X plan view of an ion source according to yet another embodiment.
Figure 8B:
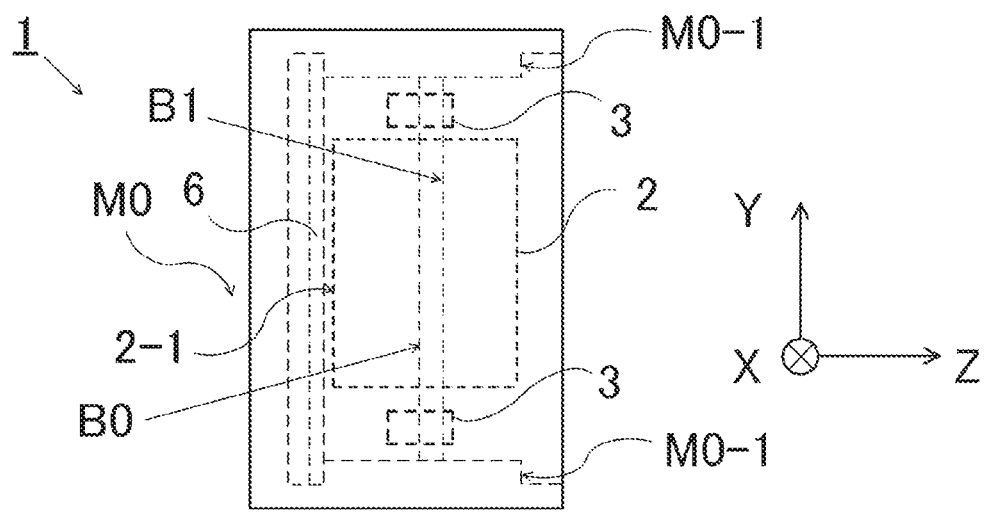
Figure 8C:
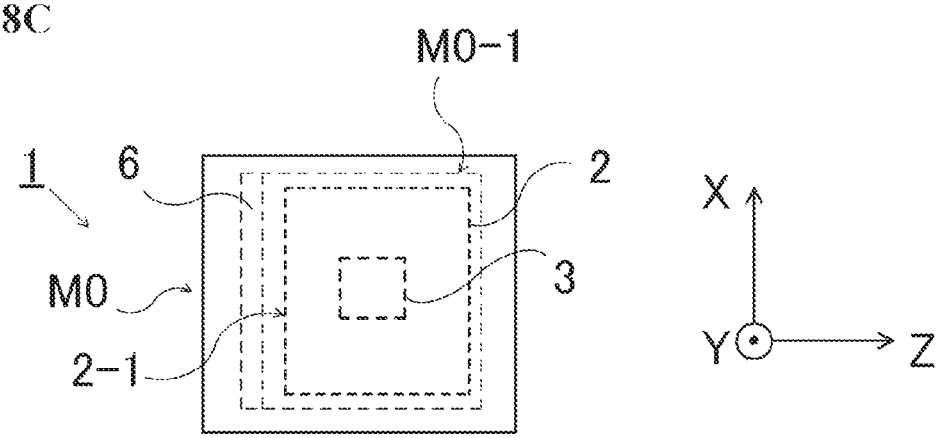

FIGS. 8A-8C are, respectively, an X-Y plan view, a Y-Z plan view and a Z-X plan view of an ion source according to yet another embodiment. In this embodiment, rather than using a pair of electromagnets, an electromagnet having a C-shaped yoke may be employed. In FIGS. 8A-8C, like reference numbers are used for like components.

In this case, a configuration for shifting the magnetic field center by providing a magnetic shield 6 may be provided as shown in FIGS. 8A-8C. Alternatively, a magnetic shield may be provided on each side or on one of opposite sides of magnetic poles in the ion beam extraction direction. Alternatively, a configuration for shifting the magnetic field center may be provided by a mechanism for moving part of magnet poles, such as by rotationally and/or linearly moving part of the magnet poles using the mechanism, as with the above embodiments.

Alternatively, an electromagnet having a yoke with an H-shaped interior space may be employed. In this case, the magnetic field center may be moved in a similar manner to the C-shaped yoke embodiment shown in FIGS. 8A-8C.

Considering plasma generation efficiency, it is advantageous to efficiently capture electrons emitted from the electron supply 3, by a magnetic field. From this point of view, an allowable range of shifting of the magnetic field center may be limited. For example, the ion source according to the embodiment depicted in FIGS. 2A-2C may be configured such that the magnetic field center is limitedly shifted within an installation range of the electron supply 3 in a Z-X plan view.

The ion source according to the embodiments disclosed herein is applicable to an ion beam irradiation apparatus such as an ion implantation apparatus, an ion doping apparatus, or a surface modification apparatus using an ion beam.

Although the above embodiments have been described based on an example in which a shift means to shift the magnetic field center is composed of: a magnetic shield; a drive mechanism for rotating and/or linearly moving an electromagnet; or a plurality of electromagnets arranged in different positions in the ion beam extraction direction, or an additional electromagnet, such various shift means may be appropriately used in the form of a combination of two or more of them.

It should be understood that the inventive concept is not limited to the above embodiments, but various other changes and modifications may be made therein without departing from the spirit and scope as set forth in appended claims.

What is claimed is:

1. An ion source comprising:
 a plasma generation container that generates a plasma from which an ion beam is extracted in an ion beam extraction direction;
 an electron supply that supplies electrons into the plasma generation container to generate the plasma;
 an electromagnet that generates a magnetic field for capturing the electrons from the electron supply; and
 shift means for shifting a center of the magnetic field in the ion beam extraction direction to change a rate of a desired type of ion to be contained in the ion beam.

2. The ion source as recited in claim 1, wherein the shift means displaces a center of the electromagnet in the ion beam extraction direction.

3. The ion source as recited in claim 1, wherein the shift means comprises a plurality of electromagnets arranged at different positions in the ion beam extraction direction.

4. The ion source as recited in claim 3, wherein the shift means shifts a center of the magnetic field in the ion beam extraction direction by adjusting a magnetic density of a magnetic field generated by each of the plurality of electromagnets.

5. The ion source as recited in claim 1, wherein the shift means comprises a detachable magnetic shield that shields the magnetic field of the electromagnet.

6. The ion source as recited in claim 5, wherein the magnetic shield is disposed on one side or on each of opposite sides of the electromagnet in the ion beam extraction direction.

7. The ion source as recited in claim 5, wherein a distance between the electromagnet and the detachable magnetic shield is variably set in the ion beam extraction direction.

8. An ion beam irradiation apparatus comprising the ion source as recited in claim 1.

9. A method of operating an ion source that includes a plasma generation container that generates a plasma from which an ion beam is extracted in an ion beam extraction direction; an electron supply that supplies electrons into the plasma generation container to generate the plasma; and an electromagnet that generates a magnetic field for capturing the electrons from the electron supply, the method comprising:
 shifting a center of the magnetic field in the ion beam extraction direction to change a rate of a desired type of ion to be contained in the ion beam.

10. An ion source comprising:
 a plasma generation container that generates a plasma from which an ion beam is extracted in an ion beam extraction direction;
 an electron supply that supplies electrons into the plasma generation container to generate the plasma;
 two electromagnets, disposed at opposite sides of the plasma generation container in a first direction that is orthogonal to an ion beam extraction direction, that generate a magnetic field for capturing the electrons from the electron supply; and
 a detachable magnetic shield attached to at least one of the two electromagnets.

11. The ion source as recited in claim 10, wherein the detachable magnetic shield is attached to the two electromagnets.

12. The ion source as recited in claim 10, further comprising a spacer provided between the magnetic shield and the at least one of the two electromagnets.

13. The ion source as recited in claim 10, wherein the detachable magnetic shield is disposed on one side or on each of opposite sides of the at least one of the two electromagnets in the ion beam extraction direction.

14. The ion source as recited in claim 10, wherein the detachable magnetic shield comprises a plurality of detachable magnetic shields, one detachable magnetic shield attached to each end in the ion extraction direction of the at least one of the two electromagnets.

15. The ion source as recited in claim 10, wherein a distance between the at least one of the two electromagnets and the detachable magnetic shield is variably set in the ion beam extraction direction.

\* \* \* \* \*